(12) United States Patent
Fulton et al.

(10) Patent No.: US 11,910,524 B2
(45) Date of Patent: *Feb. 20, 2024

(54) BACKLIT USER INTERFACE

(71) Applicant: Molex, LLC, Lisle, IL (US)

(72) Inventors: Steven Fulton, Lisle, IL (US);
Matthew Shannon, Lisle, IL (US)

(73) Assignee: Molex, LLC, Lisle, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/085,611

(22) Filed: Dec. 21, 2022

(65) Prior Publication Data

US 2023/0120952 A1    Apr. 20, 2023

Related U.S. Application Data

(63) Continuation of application No. 16/769,243, filed as application No. PCT/US2018/064662 on Dec. 10, 2018, now Pat. No. 11,589,456.

(Continued)

(51) Int. Cl.
*H05K 1/02* (2006.01)
*G06F 3/044* (2006.01)
(Continued)

(52) U.S. Cl.
CPC ........... *H05K 1/0274* (2013.01); *G06F 3/044* (2013.01); *H03K 17/962* (2013.01);
(Continued)

(58) Field of Classification Search
CPC .. H05K 1/0274; H05K 1/0281; H05K 1/0326; H05K 1/0393; H05K 1/09;
(Continued)

(56) References Cited

U.S. PATENT DOCUMENTS 7,071,433 B2    7/2006    Holscher
2005/0103611 A1    5/2005    Holscher
(Continued)

FOREIGN PATENT DOCUMENTS

| CN | 102835030 A | 12/2012 |
| CN | 105814528 A | 7/2016 |
| WO | 2019113567 A1 | 6/2019 |

OTHER PUBLICATIONS

International Preliminary Report on Patentability received for PCT application No. PCT/US2018/064662, dated Jun. 18, 2020, 05 Pages.

(Continued)

*Primary Examiner* — Peter D McLoone

(57) ABSTRACT

A number of user interface devices are described. In one example, a user interface device includes a lens having a graphic visible through the lens, a transparent circuit film comprising a top surface and a bottom surface, a reflector film bonded to the bottom surface of the transparent circuit film, the reflector film including an embossed area which defines a pocket between the reflector film and the bottom surface of the transparent circuit film, a light emitting diode (LED) bonded to the bottom surface of the transparent circuit film and positioned within the pocket between the reflector film and the bottom surface of the transparent circuit film, and a layer of transparent pressure-sensitive adhesive interposed between the bottom surface of the lens and the top surface of the transparent circuit film.

20 Claims, 2 Drawing Sheets

Related U.S. Application Data

(60) Provisional application No. 62/596,522, filed on Dec. 8, 2017.

(51) Int. Cl.
 *H03K 17/96* (2006.01)
 *H05K 1/03* (2006.01)
 *H05K 1/09* (2006.01)

(52) U.S. Cl.
 CPC ......... *H05K 1/0281* (2013.01); *H05K 1/0326* (2013.01); *H05K 1/0393* (2013.01); *H05K 1/09* (2013.01); *G06F 2203/04103* (2013.01); *H03K 2217/960755* (2013.01); *H05K 2201/0145* (2013.01); *H05K 2201/10106* (2013.01); *H05K 2201/10121* (2013.01)

(58) Field of Classification Search
 CPC . H05K 2201/0145; H05K 2201/10106; H05K 2201/10121; G06F 3/044; H03K 17/962; H03K 2217/960755
 See application file for complete search history.

(56) References Cited

U.S. PATENT DOCUMENTS

| | | |
|---|---|---|
| 2006/0268567 A1 | 11/2006 | Jang et al. |
| 2007/0209916 A1 | 9/2007 | Clegg et al. |
| 2009/0162617 A1 | 6/2009 | Kojima et al. |
| 2010/0110327 A1* | 5/2010 | Kim .................. G02F 1/133608 |
| | | 445/24 |
| 2011/0012845 A1 | 1/2011 | Rothkopf et al. |
| 2013/0194759 A1 | 8/2013 | Kang et al. |
| 2013/0248344 A1 | 9/2013 | Stilwell |
| 2014/0313169 A1 | 10/2014 | Kravets et al. |
| 2015/0062490 A1 | 3/2015 | Kwon |
| 2016/0103365 A1 | 4/2016 | Sato |
| 2017/0294278 A1 | 10/2017 | Chen et al. |
| 2021/0020393 A1* | 1/2021 | Liang .................... H01H 13/14 |

OTHER PUBLICATIONS

International Search Report and Written Opinion received for PCT application No. PCT/US2018/064662, dated Apr. 5, 2019, 07 Pages.

* cited by examiner

BACKLIT USER INTERFACE

CROSS-REFERENCE TO RELATED APPLICATIONS

This application is a continuation of U.S. Non-Provisional patent application Ser. No. 16/769,243, filed Jun. 3, 2020, titled "BACKLIT USER INTERFACE," which is the U.S. national stage application of International Patent Application No. PCT/US2018/064662, filed Dec. 10, 2018, which claims the benefit of priority under 35 U.S.C. § 119(e) of U.S. Provisional Patent Application No. 62/596,522, filed Dec. 8, 2017, the entire contents of each of which applications are hereby incorporated herein by reference.

FIELD OF THE INVENTION

The present disclosure relates to user interfaces for use on various devices, including virtual personal assistants, home appliances and medical devices.

DESCRIPTION OF RELATED ART

User interfaces for use on various devices are known. These user interfaces typically use capacitive touch sensing technology. Such user interfaces, however, traditionally require higher cost substrates like printed circuit boards (PCBs) or flexible printed circuits (FPC). These PCBs and FPCs then also require the use of molded light pipes and light guides as the PCBs and FPCs do not allow light to transfer from one side thereof to the other side thereof. Furthermore, flexible light guide films provide poor quality of backlighting and PCBs cannot accommodate curved surfaces or be in-molded. As a result, certain individuals would appreciate further improvements to user interfaces.

SUMMARY

A user interface device includes a lens with a top surface and a bottom surface, where the bottom surface includes at least one graphic that is visible through the top surface of the lens. The user interface device further includes a transparent circuit film with a top surface and a bottom surface, at least one light emitting diode (LED), at least one silver conductor, and a layer of transparent pressure-sensitive adhesive that secures the bottom surface of the lens to the top surface of the transparent circuit film.

In a first aspect, the transparent circuit film is in a fold-over configuration such that the transparent circuit film has a top layer and a bottom layer that are connected by a connecting end portion, where the top layer and the bottom layer are separated a desired distance from one another to allow for the at least one LED and at least one spacer to be positioned therebetween In a second aspect, user interface device further includes a reflector film.

BRIEF DESCRIPTION OF THE DRAWINGS

The present disclosure is illustrated by way of example, and not limited, in the accompanying figures, which are not drawn to scale, in which like reference numerals indicate similar elements and in which.

DETAILED DESCRIPTION

FIGS. 1-5 illustrate exemplary embodiments of the present disclosure and it is to be understood that the disclosed embodiments are merely exemplary of the disclosure, which may be embodied in various forms. Therefore, specific details disclosed herein are not to be interpreted as limiting, but merely as a basis for the claims and as a representative basis for teaching one skilled in the art to variously employ the present disclosure. It is further to be understood that the illustrations are not drawn to scale.

Figure 1:
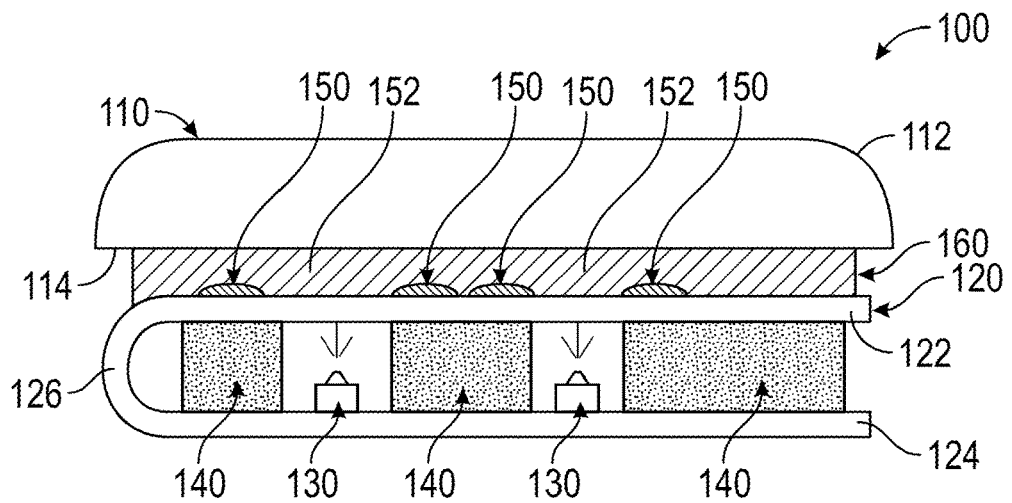
FIG. 1 illustrates features of a first embodiment of a backlit user interface.

FIG. 1 illustrates a first embodiment of a backlit user interface 100. The backlit user interface 100 includes a lens 110, a transparent circuit film 120, at least one light emitting diode (LED) 130, at least one spacer 140, at least one silver conductor 150, and a layer of transparent pressure-sensitive adhesive 160.

The lens 110 is preferably formed of plastic material which is generally transparent. The lens 110 has a top surface 112 and a bottom surface 114. The top surface 112 is preferably curved and is intended to be contacted by a user. The bottom surface 114 is preferably flat and is intended to have at least one graphic (not illustrated) provided thereon such that the graphic is visible by viewing through the top surface 112 of the lens 110. The graphic may be applied to the bottom surface 114 of the lens 110 in any suitable manner, e.g., spray paint, laser etch, screen-print or digital print.

The transparent circuit film 120 is preferably formed of polyester (PET). The transparent circuit film 120 is preferably provided in a fold-over configuration such that the transparent circuit film 120 is provided with a top layer 122 and a bottom layer 124 that are connected by a connecting end portion 126. The top layer 122 and the bottom layer 124 are separated a desired distance from one another to allow for the at least one LED 130 and the at least one spacer 140 to be positioned therebetween. The transparent circuit film 120 may be electrically connected to another portion of the device on which the backlit user interface 100 is provided, e.g., by a header connector attached to the circuit with low-temp solder, facing down away from the lens, by a tail that is compatible with a ZIF connector or by contact pads provided on the bottom layer 124, possibly with carbon coating, that are intended for pogo-pins.

The at least one LED 130 is bonded to the bottom layer 124 of the transparent circuit film 120 in a top-fire position, preferably using a low temperature solder material, such that the at least one LED 130 emits light toward and through the top layer 122 of the transparent circuit film 120.

The at least one spacer 140 is preferably formed of foam. The at least one spacer 140 is preferably bonded in place between the top and bottom layer 122, 124 of the transparent circuit film 120. The at least one spacer 140 is positioned around the at least one LED 130 and, if more than one LED 130 is provided, the at least one spacer 140 is positioned to separate one LED 130 from another LED 130.

The at least one silver conductor 150 is preferably screen printed on the top layer 122 of the transparent circuit film 120 to provide at least one capacitive touch sensor. The at least one silver conductor 150 is preferably opaque. The number of silver conductors 150 provided will typically match the number of LEDs 130 provided. Each silver conductor 150 is generally formed in a ring-like configuration such that a space 152 is defined within a middle of the ring-like configuration. In this context, ring-like is intended to mean completely closed (e.g., in an O-shape) or partially closed (e.g., in a C-shape or a U-shape). Each silver conductor 150 is positioned generally above (as viewed in FIG. 1) one of the LEDs 130 such that the space 152 defined is in general vertical alignment (as viewed in FIG. 1) with the LED 130.

The lens 110 and the transparent circuit film 120 are preferably secured to one another by the layer of transparent pressure-sensitive adhesive 160 and positioned between the bottom surface 114 of the lens 110 and either the top layer 122 of the transparent circuit film 120 or the at least one silver conductor 150. Thus, the layer of transparent pressure-sensitive adhesive 160 occupies the space 152 defined by the at least one silver conductor 150.

In operation, the light emitted by the at least one LED 130 will pass through the transparent circuit film 120, through the layer of transparent pressure-sensitive adhesive 160 (including the portion thereof that occupies space 152), and onto the graphic (as the graphic is also positioned in general vertical alignment (as viewed in FIG. 1) with the space 152), thereby providing backlighting for the user interface 100 which allows the user to easily view the graphic.

Figure 2:
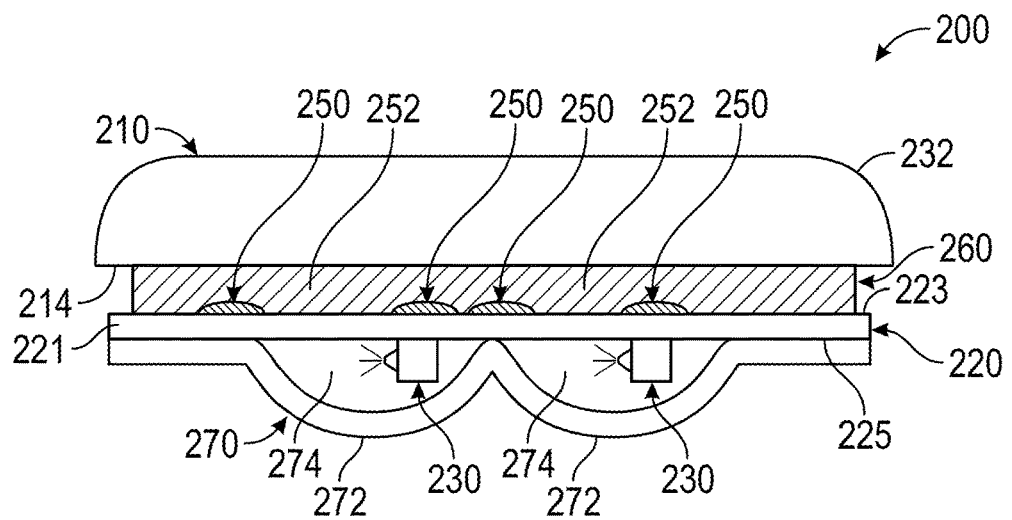
FIG. 2 illustrates features of a second embodiment of a backlit user interface.

FIG. 2 illustrates a second embodiment of a backlit user interface 200. The backlit user interface 200 includes a lens 210, a transparent circuit film 220, at least one light emitting diode (LED) 230, a reflector film 270, at least one silver conductor 250, and a layer of transparent pressure-sensitive adhesive 260.

The lens 210 is preferably formed of plastic material which is generally transparent. The lens 210 has a top surface 212 and a bottom surface 214. The top surface 212 is preferably curved and is intended to be contacted by a user. The bottom surface 214 is preferably flat and is intended to have at least one graphic (not illustrated) provided thereon such that the graphic is visible by viewing through the top surface 212 of the lens 210. The graphic may be applied to the bottom surface 214 of the lens 210 in any suitable manner, e.g., spray paint, laser etch, screen-print or digital print.

The transparent circuit film 220 is preferably formed of polyester (PET). The transparent circuit film 220 is preferably provided in a single layer 221 having a top surface 223 and a bottom surface 225. The transparent circuit film 220 may be electrically connected to another portion of the device on which the backlit user interface 200 is provided, e.g., by a header connector attached to the circuit with low-temp solder, facing down away from the lens, by a tail that is compatible with a ZIF connector or by contact pads provided on the bottom surface 225, possibly with carbon coating, that are intended for pogo-pins.

The at least one LED 230 is bonded to the bottom surface 225 of the transparent circuit film 220 in a right angle-fire position, preferably using a low temperature solder material, such that the at least one LED 230 emits light generally parallel to the transparent circuit film 220.

The reflector film 270 is preferably formed of a white reflector material. The reflector film 270 is preferably bonded in place to the bottom surface 225 of the transparent circuit film 220. The reflector film 270 is configured to provide at least one embossed area 272 which defines a pocket 274 between the reflector film 270 and the bottom surface 225 of the transparent circuit film 220. The number of pockets 274 defined corresponds to the number of LEDs 230 provided as each LED 230 is positioned in a corresponding pocket 274.

The at least one silver conductor 250 is preferably screen printed on the top surface 223 of the transparent circuit film 220 to provide at least one capacitive touch sensor. The at least one silver conductor 150 is preferably opaque. The number of silver conductors 250 provided will typically match the number of LEDs 230 provided. Each silver conductor 250 is generally formed in a ring-like configuration such that a space 252 is defined within a middle of the ring-like configuration. In this context, ring-like is intended to mean completely closed (e.g., in an O-shape) or partially closed (e.g., in a C-shape or a U-shape). Each silver conductor 250 is positioned generally above (as viewed in FIG. 2) one of the pockets 274 such that the space 252 defined is in general offset from being in vertical alignment (as viewed in FIG. 2) with the LED 230.

The lens 210 and the transparent circuit film 220 are preferably secured to one another by the layer of transparent pressure-sensitive adhesive 260 and positioned between the bottom surface 214 of the lens 210 and either the top surface 223 of the transparent circuit film 220 or the at least one silver conductor 250. Thus, the layer of transparent pressure-sensitive adhesive 260 occupies the space 252 defined by the at least one silver conductor 250.

In operation, light emitted by the at least one LED 230 will pass through the transparent circuit film 220 (either directly or after bouncing off of the reflector film 270), through the layer of transparent pressure-sensitive adhesive 260 (including the portion thereof that occupies space 252), and onto the graphic (as the graphic is also positioned in general vertical alignment (as viewed in FIG. 2) with the space 252), thereby providing backlighting for the user interface 200 which allows the user to easily view the graphic.

Figure 3:
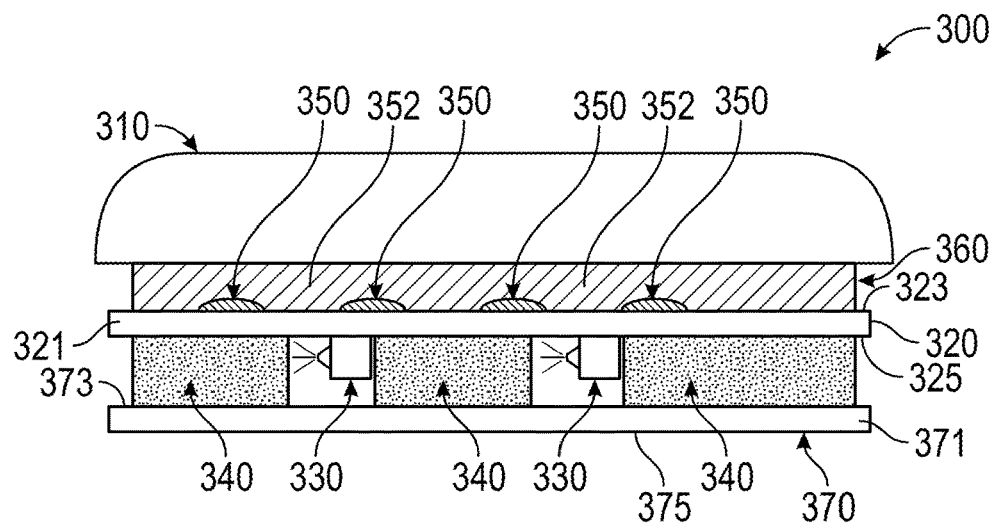
FIG. 3 illustrates features of a third embodiment of a backlit user interface.

FIG. 3 illustrates a third embodiment of a backlit user interface 300. The backlit user interface 300 includes a lens 310, a transparent circuit film 320, at least one light emitting diode (LED) 330, a reflector film 370, at least one spacer 340, at least one silver conductor 350, and a layer of transparent pressure-sensitive adhesive 360.

The lens 310 is preferably formed of plastic material which is generally transparent. The lens 310 has a top surface 312 and a bottom surface 314. The top surface 312 is preferably curved and is intended to be contacted by a user. The bottom surface 314 is preferably flat and is intended to have at least one graphic (not illustrated) provided thereon such that the graphic is visible by viewing through the top surface 312 of the lens 310. The graphic may be applied to the bottom surface 314 of the lens 310 in any suitable manner, e.g., spray paint, laser etch, screen-print or digital print.

The transparent circuit film 320 is preferably formed of polyester (PET). The transparent circuit film 320 is preferably provided in a single layer 321 having a top surface 323 and a bottom surface 325. The transparent circuit film 320 may be electrically connected to another portion of the device on which the backlit user interface 300 is provided, e.g., by a header connector attached to the circuit with low-temp solder, facing down away from the lens, by a tail that is compatible with a ZIF connector or by contact pads provided on the bottom surface 325, possibly with carbon coating, that are intended for pogo-pins.

The reflector film 370 is preferably formed of a white reflector material. The reflector film 370 is preferably provided in a single layer 371 having a top surface 373 and a bottom surface 375.

The at least one LED 330 is bonded to the bottom surface 325 of the transparent circuit film 320 in a right angle-fire position, preferably using a low temperature solder material, such that the at least one LED 330 emits light generally parallel to the transparent circuit film 320.

The at least one spacer 340 is preferably formed of foam. The at least one spacer 340 is preferably bonded in place between the bottom surface 325 of the transparent circuit film 320 and the top surface 373 of the reflector film 370. The at least one spacer 340 is positioned around the at least one LED 330 and, if more than one LED 330 is provided, the at least one spacer 340 is positioned to separate one LED 330 from another LED 330.

The at least one silver conductor 350 is preferably screen printed on the top surface 323 of the transparent circuit film 320 to provide at least one capacitive touch sensor. The at least one silver conductor 350 is preferably opaque. The number of silver conductors 350 provided will typically match the number of LEDs 330 provided. Each silver conductor 350 is generally formed in a ring-like configuration such that a space 352 is defined within a middle of the ring-like configuration. In this context, ring-like is intended to mean completely closed (e.g., in an O-shape) or partially closed (e.g., in a C-shape or a U-shape). Each silver conductor 350 is positioned generally above (as viewed in FIG. 3) one of the LEDs 330 such that the space 352 defined is in general vertical alignment (as viewed in FIG. 3) with the LED 330.

The lens 310 and the transparent circuit film 320 are preferably secured to one another by the layer of transparent pressure-sensitive adhesive 360, which is positioned between the bottom surface 314 of the lens 310 and either the top surface 323 of the transparent circuit film 320 or the at least one silver conductor 350. Thus, the layer of transparent pressure-sensitive occupies the space 352 defined by the at least one silver conductor 350.

In operation, light emitted by the at least one LED 330 will pass through the transparent circuit film 320 (either directly or after bouncing off of the reflector film 370), through the layer of transparent pressure-sensitive adhesive 360 (including the portion thereof that occupies space 352), and onto the graphic (as the graphic is also positioned in general vertical alignment (as viewed in FIG. 3) with the space 352), thereby providing backlighting for the user interface 300 which allows the user to easily view the graphic.

Figure 4:
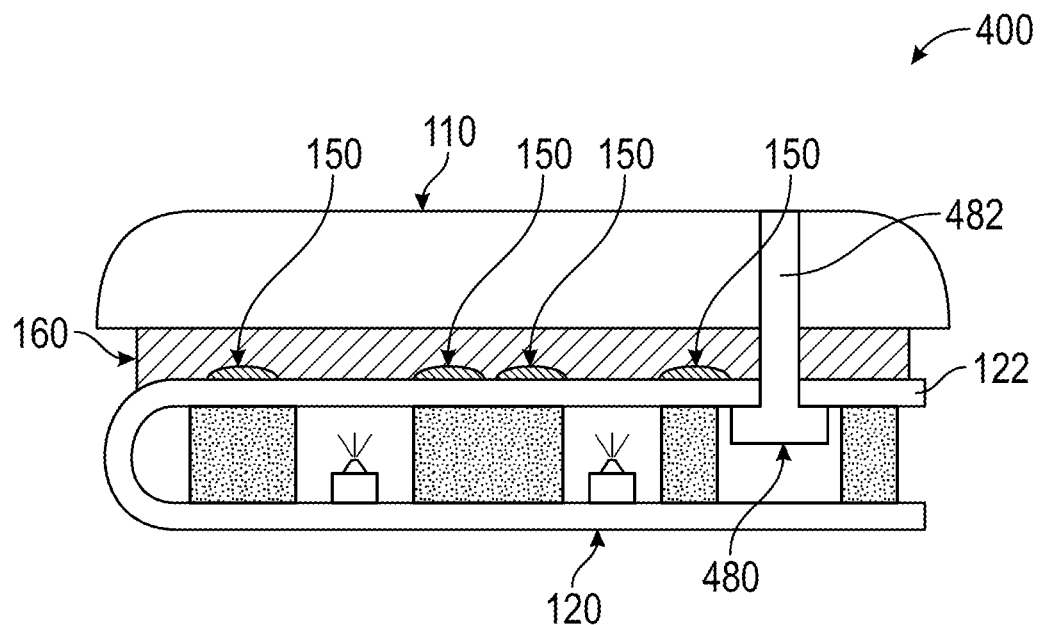
FIG. 4 illustrates features of a fourth embodiment of a backlit user interface.

FIG. 4 illustrates a fourth embodiment of a backlit user interface 400. The backlit user interface 400 is identical to the first embodiment of the backlit user interface 100 (see FIG. 1), except that backlit user interface 400 also includes a microphone 480 as a part thereof, where the lens 110, the layer of pressure-sensitive adhesive 160 and the top layer 122 of the transparent circuit film 120 have an aperture 482 therethrough for the microphone 480. The microphone 480 is preferably bonded to the top layer 122 of the transparent circuit film 120, on the opposite side of the top layer 122 as compared to the at least one silver conductor 150.

Figure 5:
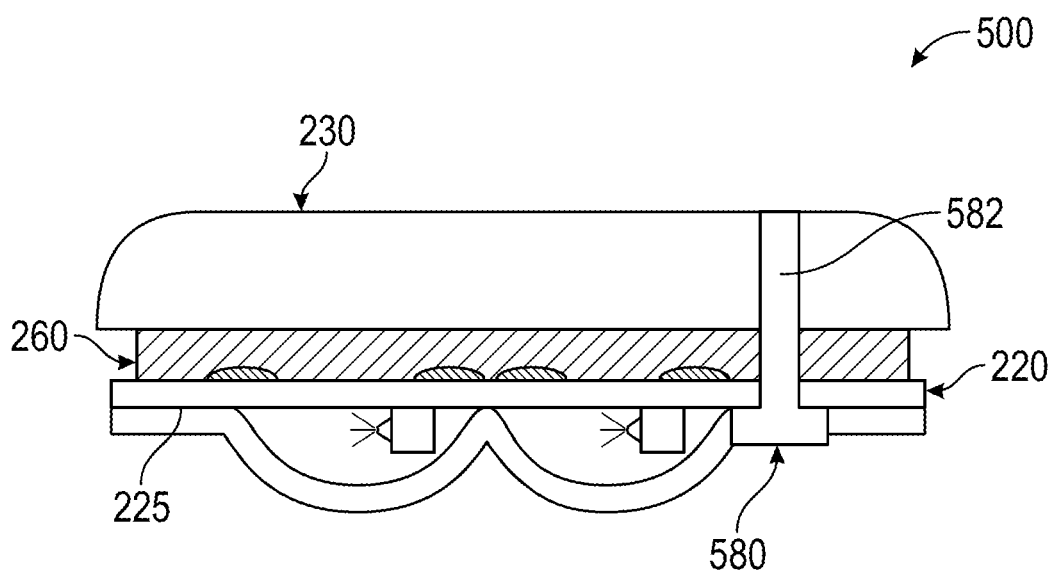
FIG. 5 illustrates features of a fifth embodiment of a backlit user interface.

FIG. 5 illustrates a fifth embodiment of a backlit user interface 500. The backlit user interface 500 is identical to the second embodiment of the backlit user interface 200 (see FIG. 2), except that the backlit user interface 500 also includes a microphone 580 as a part thereof, where the lens 210, the layer of pressure-sensitive adhesive 260 and the transparent circuit film 220 have an aperture 582 therethrough for the microphone 580. The microphone 580 is preferably bonded to the bottom surface 225 of the transparent circuit film 220.

It will be understood that there are numerous modifications of the illustrated embodiments described above which will be readily apparent to one skilled in the art, including combinations of features disclosed herein that are individually disclosed or claimed herein, explicitly including additional combinations of such features, or alternatively other types of embodiments of the same. Also, there are many possible variations in the materials and configurations, including, but not limited to, as examples: (a) the embodiments could be provided with a graphic film could be used instead of a lens; (b) the embodiments could be provided with or without LEDs; (c) the embodiments could be provided with or without LED drive circuitry; (d) the embodiments could be provided with or without microphones; (e) the embodiments could be provided with or without cap-touch chip and firmware; (f) the embodiments could be provided with backlighting of a user interface with LEDs bonded to a low-cost circuit (which provides lower cost as compared to traditional backlit user interfaces); (g) the embodiments could be provided with a substrate that is flexible polyester (which provides the benefits of being lower cost, flexible and transparent); (h) the embodiments could utilize reflective material behind the LEDs to direct the light to the user (which provides better lighting quality); (i) the embodiments could have graphic overlays on top surfaces to create backlit icons; (j) the embodiments could have combined graphical and electrical circuit on one substrate material (which provides lower costs); (k) the embodiments could have graphic/circuit in-molded into a lens/bezel (which allows for use of a curved surface and better appearance); (l) the embodiments could have capacitive touch for sensing user input; (m) the embodiments could have capacitive sensors with ring geometry, allowing backlighting through the transparent center of the ring (which allows for backlighting for keys and better quality than light guide film); (n) the embodiments could have a transparent center of the touch sensor with either no conductor or a transparent conductor (which provides improved backlighting and improved capacitive sensing through thick materials); (o) the embodiments could have LEDs bonded to the circuit with low-temp solder (which provides that there is no substrate damage during SMT); (p) the embodiments could have microprocessor-based circuitry included on the polyester circuit (which provides lower cost); (q) the embodiments could have silver circuit traces applied to the substrate with screen printing (which provides lower cost); (r) the embodiments could have LEDs located a distance away from the capacitive sensor to improve capacitive sensitivity (which allows touch sensing through thicker materials; (s) the embodiments could have LEDs which are top-fire, right-angle fire, or reverse-fire (which provides different options for quality lighting); (t) the embodiments could have transparent, conductive ink provided in the opening defined by the silver conductor, such that the silver conductor does not need to surround the opening as much as it needs to if the transparent, conductive ink is not used.

At least the following is claimed:
1. A user interface device, comprising:
   a lens comprising a graphic visible through the lens;
   a transparent circuit film comprising a top surface and a bottom surface;
   a reflector film bonded to the bottom surface of the transparent circuit film, the reflector film comprising an embossed area which defines a pocket between the reflector film and the bottom surface of the transparent circuit film;

a light emitting diode (LED) bonded to the bottom surface of the transparent circuit film and positioned within the pocket between the reflector film and the bottom surface of the transparent circuit film; and a layer of transparent pressure-sensitive adhesive interposed between the bottom surface of the lens and the top surface of the transparent circuit film to secure the bottom surface of the lens to the top surface of the transparent circuit film.

2. The user interface device of claim 1, wherein a top surface of the lens is curved.

3. The user interface device of claim 1, wherein the graphic is applied to a bottom surface of the lens by at least one of spray paint, laser etch, screen-print, or digital print.

4. The user interface device of claim 3, wherein the bottom surface of the lens is flat.

5. The user interface device of claim 1, wherein the transparent circuit film is formed of polyester (PET).

6. The user interface device of claim 1, wherein the LED is bonded to the bottom surface of the transparent circuit film in a right angle-fire position.

7. The user interface device of claim 1, further comprising a microphone bonded to the bottom surface of the transparent circuit film.

8. The user interface device of claim 7, wherein the lens and the transparent circuit film each comprise an aperture therethrough for the microphone.

9. The user interface device of claim 1, further comprising a silver conductor on the top surface of the transparent circuit film.

10. The user interface device of claim 9, wherein:
the silver conductor is formed in a ring on the top surface of the transparent circuit film to provide at least one capacitive touch sensor; and
the ring of the silver conductor is aligned with the embossed area which defines the pocket.

11. The user interface device of claim 1, wherein:
the reflector film comprises a plurality of embossed areas which define a plurality of pockets between the reflector film and the bottom surface of the transparent circuit film; and
the LED comprises a plurality of LEDs, at least one LED among the plurality of LEDs being positioned within a respective pocket among the plurality of pockets.

12. A user interface device, comprising:
a lens;
a top film layer and a bottom film layer under the lens, the bottom film layer comprising an embossed area which defines a pocket between the bottom film layer and a bottom surface of the top film layer; and
a light emitting diode (LED) positioned within the pocket between the top film layer and the bottom film layer.

13. The user interface device of claim 12, wherein:
the top film layer comprises a transparent circuit film; and
the LED is bonded to a bottom surface of the transparent circuit film.

14. The user interface device of claim 13, wherein the LED is bonded to the bottom surface of the transparent circuit film in a right angle-fire position.

15. The user interface device of claim 12, further comprising a microphone bonded to the top film layer.

16. The user interface device of claim 15, wherein the lens comprises an aperture therethrough for the microphone.

17. The user interface device of claim 12, further comprising a silver conductor on a top surface of the top film layer.

18. The user interface device of claim 17, wherein:
the silver conductor is formed in a ring on the top surface of the top film layer to provide at least one capacitive touch sensor; and
the ring of the silver conductor is aligned with the embossed area which defines the pocket.

19. The user interface device of claim 12, wherein:
the top film layer comprises a transparent circuit film;
the LED is bonded to a bottom surface of the transparent circuit film; and
the bottom film layer comprises a reflector film.

20. The user interface device of claim 12, wherein:
the bottom film layer comprises a plurality of embossed areas which define a plurality of pockets between the bottom film layer and the bottom surface of the top film layer; and
the LED comprises a plurality of LEDs, at least one LED among the plurality of LEDs being positioned within a respective pocket among the plurality of pockets.

\* \* \* \* \*